(12) United States Patent
Hwang et al.

(10) Patent No.: US 11,728,381 B2
(45) Date of Patent: Aug. 15, 2023

(54) ELECTROSTATIC DISCHARGE (ESD) DEVICE WITH IMPROVED TURN-ON VOLTAGE

(71) Applicant: GLOBALFOUNDRIES Singapore Pte. Ltd., Singapore (SG)

(72) Inventors: Kyongjin Hwang, Singapore (SG); Raunak Kumar, Sembawang (SG); Robert J. Gauthier, Jr., Williston, VT (US)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 238 days.

(21) Appl. No.: 17/238,755

(22) Filed: Apr. 23, 2021

(65) Prior Publication Data

US 2022/0344470 A1 Oct. 27, 2022

(51) Int. Cl.
*H01L 29/10* (2006.01)
*H01L 29/66* (2006.01)
(Continued)

(52) U.S. Cl.
CPC ...... *H01L 29/1008* (2013.01); *H01L 27/0259* (2013.01); *H01L 27/0288* (2013.01); *H01L 29/6625* (2013.01); *H01L 29/735* (2013.01)

(58) Field of Classification Search
CPC ............ H01L 29/1008; H01L 27/0288; H01L 29/6625; H01L 29/735; H01L 29/0646; H01L 29/0821; H01L 29/7304; H01L 27/0248; H01L 27/0296; H01L 29/0684; H01L 21/8222; H01L 21/8248–8249;
(Continued)

(56) References Cited

U.S. PATENT DOCUMENTS 5,521,105 A   5/1996 Hsu et al.
6,465,768 B1  10/2002 Ker et al.
(Continued)

FOREIGN PATENT DOCUMENTS

EP    0803955 A2   10/1997

OTHER PUBLICATIONS

Yong-Ru Wen et al., "A Bending N-Well Ballast Layout to Improve ESD Robustness in Fully-Silicided CMOS Technology", IRPS10-857, IEEE, 2010, 4 pages.
(Continued)

*Primary Examiner* — Wasiul Haider
(74) *Attorney, Agent, or Firm* — Francois Pagette; Andrew M. Calderon; Calderon Safran & Cole, P.C.

(57) ABSTRACT

The present disclosure relates to semiconductor structures and, more particularly, to electrostatic discharge (ESD) devices and methods of manufacture. The structure includes a bipolar transistor device, including a base region, having a base contact region, in a first well of a first conductivity type, a collector region, having a collector contact region, in a second well of a second conductivity type, and an emitter region, having an emitter contact region, in the first well, located between the base contact region and the second well, and a reverse-doped resistance well, of the second conductivity type, located in the first well of the first conductivity type between the base contact region and the emitter contact region structured to decrease turn-on voltage of the bipolar transistor device.

20 Claims, 8 Drawing Sheets

(51) Int. Cl.
  *H01L 27/02* (2006.01)
  *H01L 29/735* (2006.01)
(58) Field of Classification Search
  CPC ............. H01L 27/0259–0262; H01L 27/0623;
      H01L 27/0635; H01L 27/0647–067;
    H01L 27/0711–0722; H01L 27/075–0783;
      H01L 27/082–0828; H01L 27/14681
  See application file for complete search history.

(56) References Cited

U.S. PATENT DOCUMENTS

| | | | |
|---|---|---|---|
| 6,566,715 | B1 | 5/2003 | Ker et al. |
| 8,120,887 | B2 | 2/2012 | Mallikararjunaswamy et al. |
| 9,431,389 | B2 | 8/2016 | Hwang et al. |
| 2004/0120086 | A1 | 6/2004 | Vassilev et al. |
| 2013/0328103 | A1 | 12/2013 | Salcedo |
| 2015/0129977 | A1 | 5/2015 | Chen et al. |
| 2019/0103396 | A1* | 4/2019 | Zhan ................ H01L 29/0821 |
| 2023/0078157 | A1 | 3/2023 | Hwang |
| 2023/0121127 | A1 | 4/2023 | Hwang |

OTHER PUBLICATIONS

German Office Action dated Nov. 30, 2022 in related DE Application No. 10 2022 109 711.0, 7 pages.
Brief Translation of German Office Action dated Dec. 12, 2022 in DE Application No. 10 2022 109 711.0, 1 page.
Ming-Dou Ker, Tung-Yang Chen, "Substrate-Triggered ESD Protection Circuit Without Extra Process Modification" IEEE Journal of Solid-State Circuits, vol. 38, No. 2, Feb. 2003, 8 pages.
Specification and drawings for U.S. Appl. No. 18/308,322, filed Apr. 27, 2023, 24 pages.

* cited by examiner

FIG. 6A
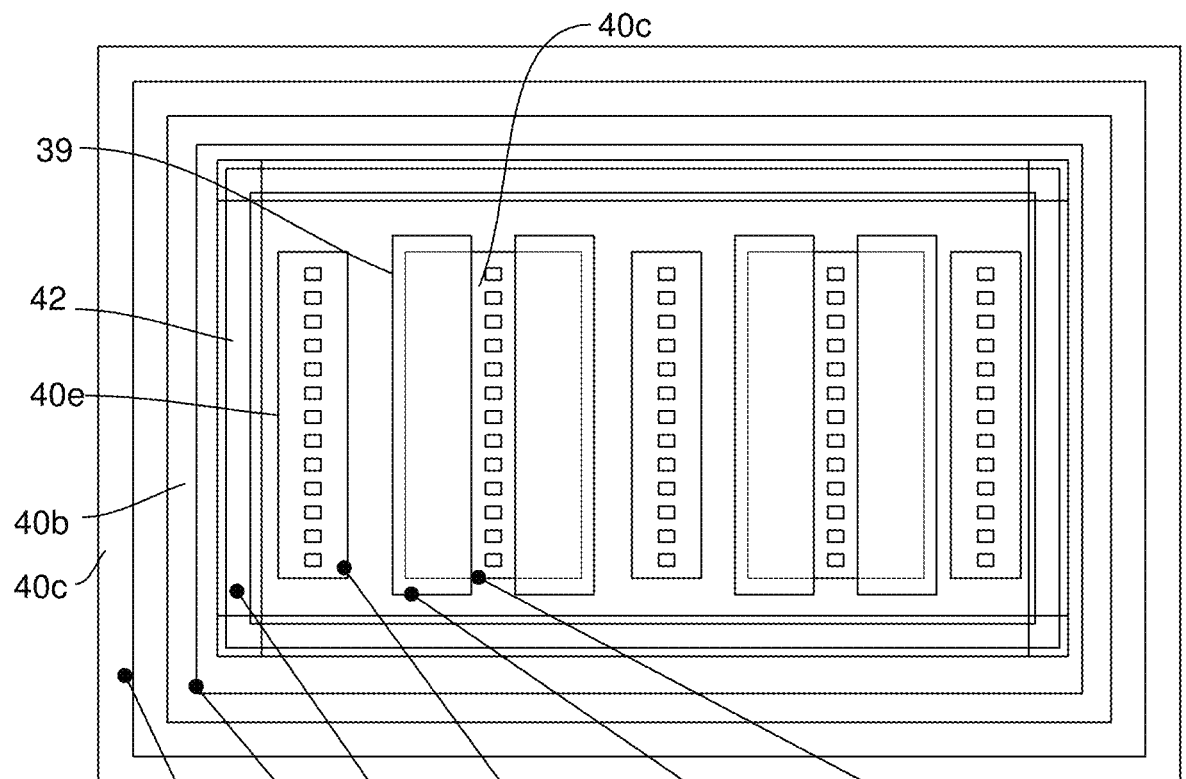
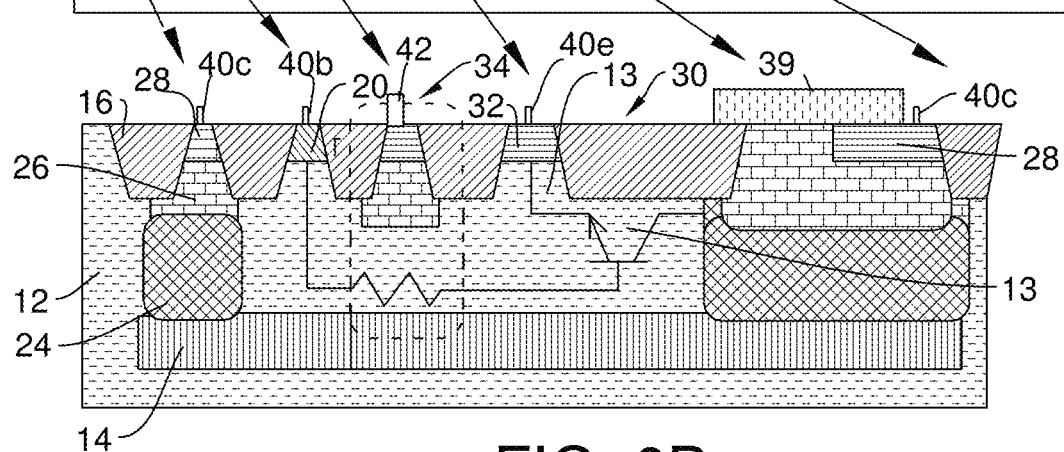
FIG. 6B

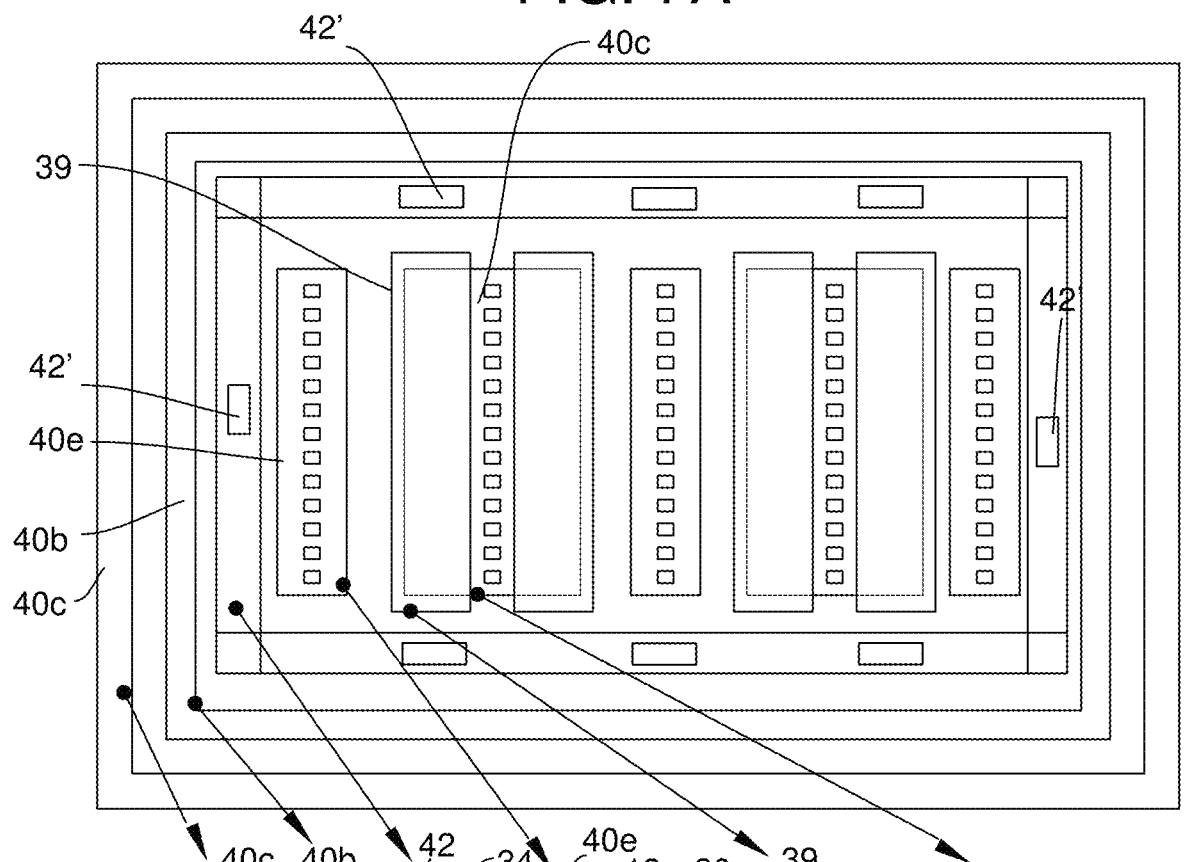
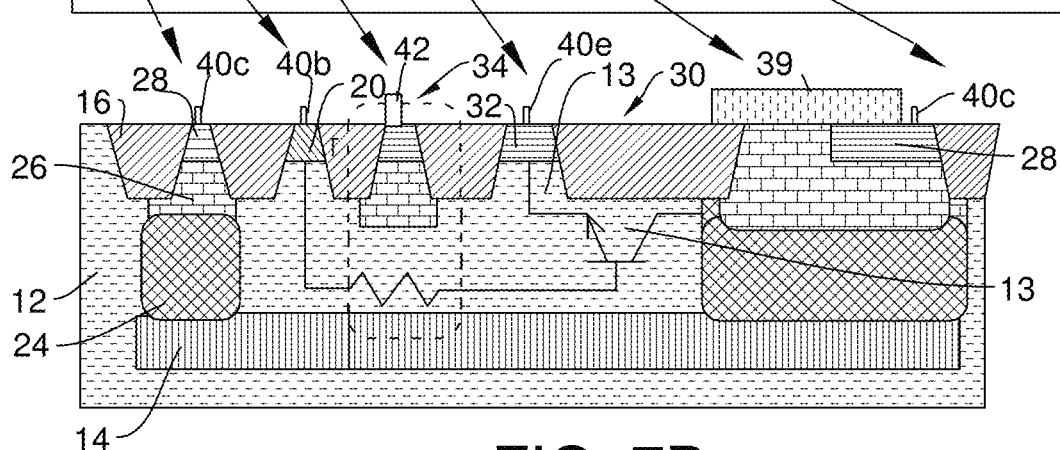

| Device | DC BV (V) | trigger voltage (V) |
|---|---|---|
| Device A | 33.4 | 42.07 |
| Device B | 33.3 | 37.00 |
| Device C | 33.0 | 36.47 |

ELECTROSTATIC DISCHARGE (ESD) DEVICE WITH IMPROVED TURN-ON VOLTAGE

FIELD OF THE INVENTION

The present disclosure relates to semiconductor structures and, more particularly, to electrostatic discharge (ESD) devices with improved turn-on voltage and methods of manufacture.

BACKGROUND

To protect semiconductor circuits, features are typically provided to protect against electrostatic discharge (ESD), which is a sudden transient flow of charge that can cause electrical shorts or dielectric breakdowns. In fact, ESD events can cause the failure of solid state electronic components on such integrated circuit chips. For example, ESD events can potentially lead to core circuits being damaged, resulting in gate oxide pin holes, junction damage, metal damage, and surface charge accumulation. Moreover, ESD events can induce latch-up, which can cause permanent damage to the circuit.

To prevent such issues, ESD devices may be integrated directly into integrated circuit (IC) chips. Such ESD devices can protect the circuit elements in the IC chips during manufacturing and/or operation of the circuits in the IC chips. For example, the ESD devices may be designed to be triggered, i.e., switched from an 'off' state to an 'on' state, when exposed to an ESD event effectively operating as a clamp to protect the circuits in the IC chip. Under normal operation, the ESD devices are in their "off" state.

In conventional ESD devices, the trigger voltage at which the high voltage ESD devices turn-on is substantially higher than the DC breakdown voltage of the devices once they are triggered under ESD stress. This can cause late turn-on which decreases the effectiveness of the ESD devices. To address this issue, ESD devices have external base resistance regions and diodes for added resistance. However, such external devices significantly increase the size of the overall ESD circuitry. Other approaches have been to use substrate current injection and current coupling effects with capacitors, but these require additional elements which increase complexity, size and cost.

SUMMARY

In an aspect of the disclosure, a structure comprises: a bipolar transistor device, including a base region, having a base contact region, in a first well of a first conductivity type, a collector region, having a collector contact region, in a second well of a second conductivity type, and an emitter region, having an emitter contact region, in the first well, located between the base contact region and the second well; and a reverse-doped resistance well, of the second conductivity type, located in the first well of the first conductivity type between the base contact region and the emitter contact region and structured to decrease turn-on voltage of the bipolar transistor device.

In an aspect of the disclosure, a bipolar transistor device comprising: a substrate having a first conductivity type; an isolation region in the substrate, wherein the isolation region has a second conductivity type; a base region, including a base contact region, in a first well of the first conductivity type over a first portion of the isolation region; a collector region, including a collector contact region, in a second well of the second conductivity type over a second portion of the isolation region; an emitter region, having an emitter contact region, in the first well, located between the base contact region and the second well; and a reverse-doped resistance element, comprised of a third well having the second conductivity type, located in the first well of the first conductivity type between the base contact region and the emitter contact region.

In an aspect of the disclosure, a method comprising: forming a bipolar transistor device, including a base region, having a base contact region, in a first well of a first conductivity type, a collector region, having a collector contact region, in a second well of a second conductivity type, and an emitter region, having an emitter contact region, in the first well, located between the base contact region and the second well; and forming a reverse-doped resistance well, of the second conductivity type, located in the first well of the first conductivity type between the base contact region and the emitter contact region and structured to decrease turn-on voltage of the bipolar transistor device.

BRIEF DESCRIPTION OF THE DRAWINGS

The present disclosure is described in the detailed description which follows, in reference to the noted plurality of drawings by way of non-limiting examples of exemplary embodiments of the present disclosure.

FIGS. 6A-6B and 7A-7B show top views and cross-sectional views, respectively, of an electrostatic discharge (ESD) device in accordance with other aspects of the present disclosure.

DETAILED DESCRIPTION

Figure 1A:
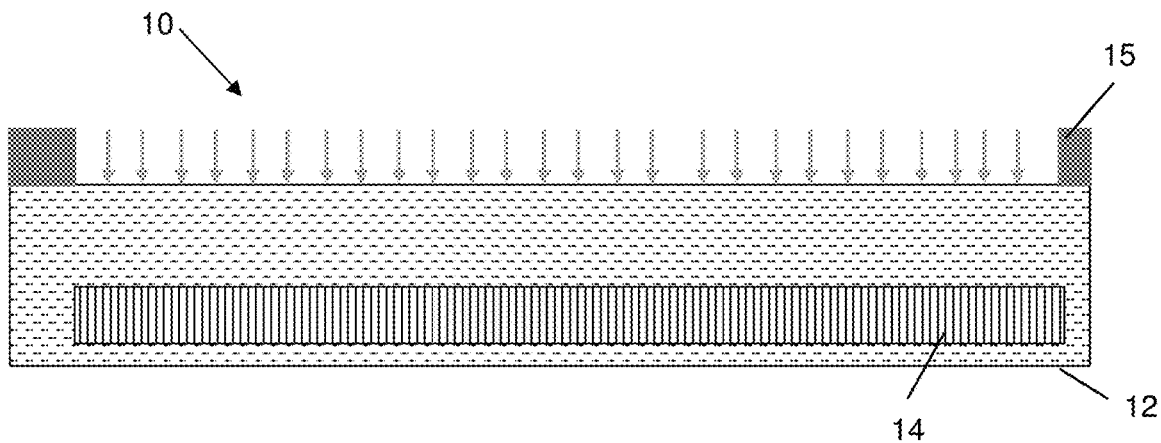
FIGS. 1A-1D show different stages of fabrication of an electrostatic discharge (ESD) device in accordance with aspects of the present disclosure.

The present disclosure relates to semiconductor structures and, more particularly, to electrostatic discharge (ESD) devices with improved turn-on voltage and methods of manufacture. In more specific embodiments, the ESD devices include a reverse-type doped resistance well in the base well to improve turn-on voltage. More specifically, the present disclosure relates to ESD bipolar devices which provide a resistance region using a reverse-type doped resistance well in the base well of an NPN ESD device and/or PNP ESD device. Advantageously, the present disclosure provides ESD performance improvement in ESD device technologies, e.g., fast turn-on time and lower trigger voltage, while effectively saving area compared to a conventional device structure.

In embodiments, the ESD device may be a NPN or PNP bipolar device formed using a CMOS process to include a base well and a collector well, formed adjacent to one another over a buried isolation region in a semiconductor substrate. High impurity base and emitter contact regions may both be formed in the base well, and a high impurity collector contact region may be formed in the adjacent collector well. In this arrangement the base and emitter contact regions can both be coupled to a ground voltage. The collector contact region may be connected to receive any ESD surge voltage that occurs to turn-on the ESD device to avoid the ESD surge voltage from damaging the protected circuit. The ESD device can normally be turned off when no ESD event is occurring. Also, optionally, the collector contact region may be coupled to a collector bias voltage.

In embodiments, the resistance region provided in the base well increases the internal resistance on the ESD device to thereby bring the trigger voltage of the device closer to the device breakdown voltage. In embodiments, the resistance region may be a well with a reverse-type doped resistance located in the base well between the base contact region and the emitter contact region. For example, if the base well is a P-well formed over an N-type isolation region in a P-type substrate, the reverse-type doped well may be an N-type well formed in the P-type base well between the base contact region and the emitter contact region. The upper surface of the reverse-type doped resistance well may be exposed to an upper surface of the device, and can either be floating (i.e., have no electrical connections to external voltages) or connected to a collector bias voltage that is applied to the collector contact region. Alternatively, the reverse-type doped resistance well may be a buried well formed under a shallow trench isolation region formed in the upper surface of the substrate between the base contact region and the emitter contact region.

In embodiments, the reverse-type doped resistance well may have a higher concentration density at an upper portion thereof than a concentration density at a lower portion thereof. This may be achieved by providing a high impurity upper region in a lower impurity, lower region.

The ESD devices of the present disclosure may be manufactured in a number of ways using a number of different tools. In general, though, the methodologies and tools are used to form structures with dimensions in the micrometer and nanometer scale. The methodologies, i.e., technologies, employed to manufacture the ESD device of the present disclosure have been adopted from integrated circuit (IC) technology. For example, the structures are built on wafers and are realized in films of material patterned by photolithographic processes on the top of a wafer. In particular, the fabrication of the ESD device uses three basic building blocks: (i) deposition of thin films of material on a substrate, (ii) applying a patterned mask on top of the films by photolithographic imaging, and (iii) etching the films selectively to the mask.

FIG. 1A shows a beginning structure and respective fabrication processes in accordance with aspects of the present disclosure. More specifically, the ESD device 10 of FIG. 1A includes a substrate 12 composed of any suitable semiconductor material including, but not limited to, Si, SiGe, SiGeC, SiC, Ge alloys, GaAs, InAs, InP, and other III/V or II/VI compound semiconductors. The substrate 12 may comprise any suitable crystallographic orientation (e.g., a (100), (110), (111), or (001) crystallographic orientation). The substrate 12 may be a single semiconducting material such as bulk silicon or composed of semiconductor on insulator (SOI) technologies. In embodiments, the substrate 12 is a P-type substrate.

Still referring to FIG. 1A, the substrate 12 includes an isolation region 14 formed as a buried layer in the substrate 12. In an NPN bipolar application, in which the substrate 12 is P-type, the isolation region 14 comprises a N-type region. In a PNP bipolar application, in which the substrate 12 is N-type, the isolation region 14 may be a P-type. The isolation region 14 may be formed by introducing a different dopant type into the substrate 12 by, for example, ion implantation processes. For example, if the isolation region 14 is P-type it may be doped with p-type dopants, e.g., Boron (B), and if it is N-type it may be doped with n-type dopants, e.g., Arsenic (As), Phosphorus (P) and Antimony (Sb), among other suitable examples. Alternatively, the isolation region 14 could be formed in an epitaxial region formed over the substrate 12 using conventional epitaxial deposition techniques.

In the ion implantation processes, a patterned implantation mask 15 may be used to define a selected area or areas exposed for the implantations. The implantation mask 15 used to select the exposed area for the isolation region 14 is stripped after implantation. The implantation mask 15 may include a layer of a light-sensitive material, such as an organic photoresist, applied by a spin coating process, pre-baked, exposed to light projected through a photomask, baked after exposure, and developed with a chemical developer. The implantation mask 15 has a thickness and stopping power sufficient to block masked areas against receiving a dose of the implanted ions. Solely for purposes of example, the isolation region 14 may be doped between $1 \times 10^{18}$ to $5 \times 10^{19}$ cm$^3$.

Figure 1B:
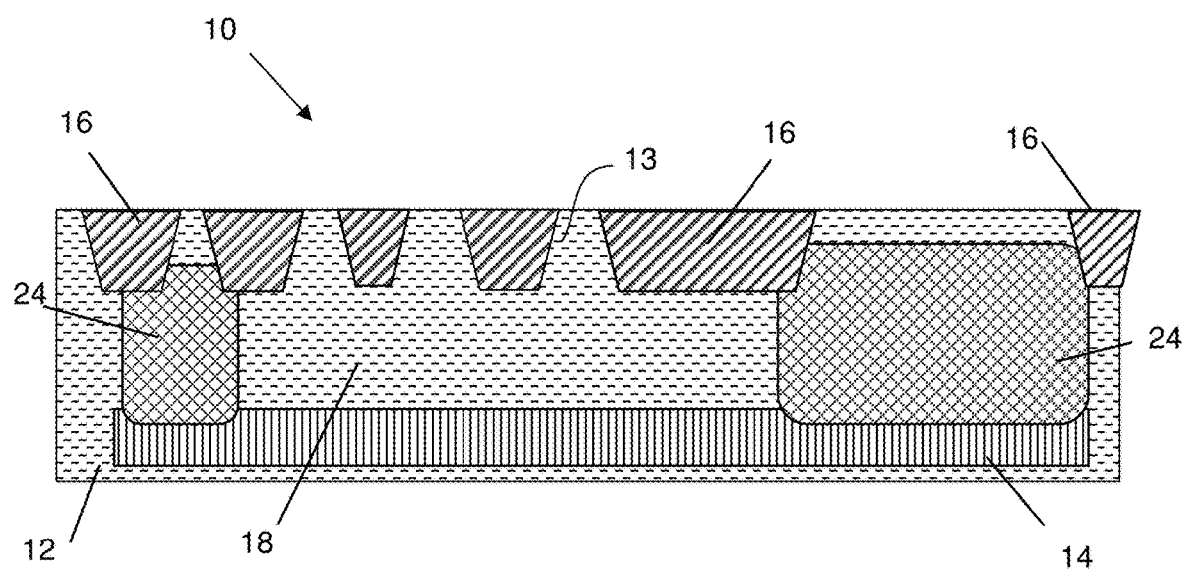

In FIG. 1B, following the implantation process, an epitaxial region 13 may be formed over the isolation region 14 using conventional epitaxial deposition techniques. In this way, the isolation region 14 can now be buried within the substrate 12. The epitaxial region 13 may be a semiconductor material formed on the substrate 12 using conventional epitaxial growth processes such that no further explanation is required herein for a complete understanding of the present disclosure. In embodiments, the epitaxial region 13 may be the same semiconductor material as the substrate 12, and may serve as the substrate for the base, emitter, collector and resistance regions formation, as will be discussed below. In alternative embodiments, the p-substrate 12 can be used for the base, emitter, collector and resistance regions.

Still referring to FIG. 1B, a plurality of shallow trench isolation structures 16 may be formed in the epitaxial region 13 of the substrate 12. The shallow trench isolation structures 16 may be formed by conventional lithography, etching and deposition methods known to those of skill in the art. For example, a resist formed over the substrate 12 (e.g., the epitaxial region 13) is exposed to energy (light) to form a pattern (opening). An etching process with a selective chemistry, e.g., RIE, will be used to form one or more trenches in the substrate 12 through the openings of the resist. Following the resist removal by a conventional oxygen ashing process or other known stripants, insulator material may be deposited by any conventional deposition processes, e.g., CVD processes, to form the shallow trench isolation structures 16.

Still referring to FIG. 1B, in embodiments, the substrate 12 includes a base well 18 and, optionally, a low impurity concentration collector well 24 formed in the epitaxial region 13 over the isolation region 14. In a NPN bipolar application the base well 18 is a P-type region and the low impurity concentration collector well 24 is an N-type region. In a PNP bipolar application the base well 18 is a N-type region, and the low impurity concentration collector well 24 is a P-type region.

The wells 18 and 24 may be formed by introducing a different dopant type into the epitaxial region 13 by, for example, ion implantation processes using a patterned implantation mask such as described above for forming the isolation region 14. For example, if the wells 18 or 24 are P-type they may be doped with p-type dopants, e.g., Boron (B), and if they are N-type they may be doped with n-type dopants, e.g., Arsenic (As), Phosphorus (P) and Antimony (Sb), among other suitable examples. Solely for purposes of example, the wells 18 and 24 may be doped at a level between $1 \times 10^{16}$ to $1 \times 10^{18}$ m$^3$.

Figure 1C:
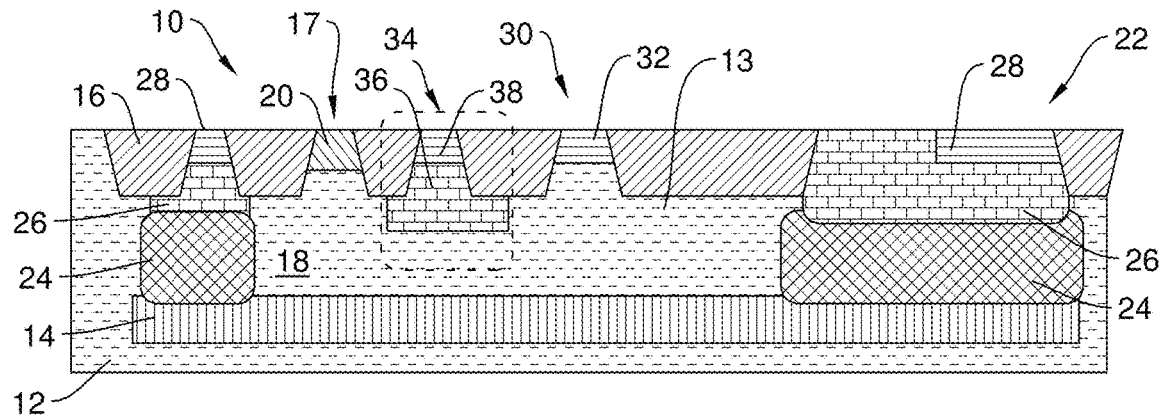

Referring to FIG. 1C, the plurality of shallow trench isolation structures 16 formed in the epitaxial region 13 of the substrate 12 may be used to separate elements in a base region 17, a collector region 22, an emitter region 30 and a resistance region 34 from one another. In FIG. 1C, a high impurity concentration collector well 26 may be formed overlapping the low impurity concentration collector well 24, and a resistance well 36 may be formed as a reverse-type doped resistance region in the base well 18.

As will be discussed with regard to FIGS. 9A and 9B, the well 36 has a reverse-type doped impurity concentration from the base well 18. For example, if the base well 18 is a P-well over an N-type isolation region 14 in a P-type substrate 12, the resistance well 36 may be an N-type well formed in the P-type base well 18 between a base contact region 20 and an emitter contact region 32. This increases the resistance of the base well 18 without the need for external resistance elements to allow the trigger voltage to turn-on the ESD device 10 to be much closer to the DC breakdown voltage of the ESD device. This will effectively avoid late turn-on of the ESD device which can lead to ineffective protection of internal elements of an IC which the ESD device 10 is protecting from surge currents, as will be discussed later with regard to FIGS. 9A and 9B.

The wells 26 and 36 may be formed, for example, using ion implantation techniques such as described above for the wells 18 and 24. As noted previously, the well 24 is optional, and the high impurity concentration collector well 26 may be formed directly in the epitaxial region 13 over the isolation region 14. The wells 26 and 36 may be formed at the same time to have the same impurity concentration or may be formed in separate ion implantation operations to have different impurity concentrations. In a NPN bipolar application, the wells 26 and 36 are N-type regions. In a PNP bipolar application, in which the substrate is N-type, the wells 26 and 36 are P-type regions. Solely for purposes of a non-limiting example, the wells 26 and 36 may be doped at a level between $1 \times 10^{17}$ to $5 \times 10^{18}$ cm$^{-3}$.

Still referring to FIG. 1C, in embodiments, the epitaxial region 13 further includes a collector contact region 28 formed in the high impurity concentration collector well 26, an emitter contact region 32 formed in the base well 18, and a resistance contact region 38 formed in the resistance well 36. These contact regions 28, 32 and 38 may be formed using ion implantation techniques such as described above for the wells 18 and 24. The contact regions 28, 32 and 38 may be formed at the same time to have the same impurity concentration or may be formed in separate ion implantation operations to have different impurity concentrations.

In an NPN bipolar application, the contact regions 28, 32 and 38 are N-type regions. In a PNP bipolar application, the contact regions 28, 32 and 38 are P-type regions. Solely for purposes of example, the contact regions 28, 32 and 38 may be doped at a level between $5 \times 10^{19}$ to $5 \times 10^{21}$ cm$^{-3}$. As such, these contact regions may be high impurity regions having either N++ or P++ impurity concentrations higher than the impurity concentrations of the collector well 26, the base well 18 and the resistance well 36 in which they are respectively formed.

Again referring to FIG. 1C, in embodiments, the epitaxial region 13 further includes a base contact region 20 formed in the base well 18. This base contact region 20 may be formed using ion implantation techniques such as described above for the wells 18 and 24. The base contact region 20 may be formed before or after the contact regions 28, 32 and 38, and is of opposite conductivity type to the contact regions 28, 32 and 38. In a NPN bipolar application, the base contact region 20 may be a P-type region; whereas, in a PNP bipolar application, the base contact 20 may be a N-type region. Solely for purposes of a non-limiting example, the base contact region 20 may be doped at a level between $5 \times 10^{19}$ to $5 \times 10^{21}$ cm$^{-3}$. As such, the base contact region 20 may be a high impurity region having either N++ or P++ impurity concentration higher than the impurity concentrations of the base well 18 in which it is formed.

Figure 1D:
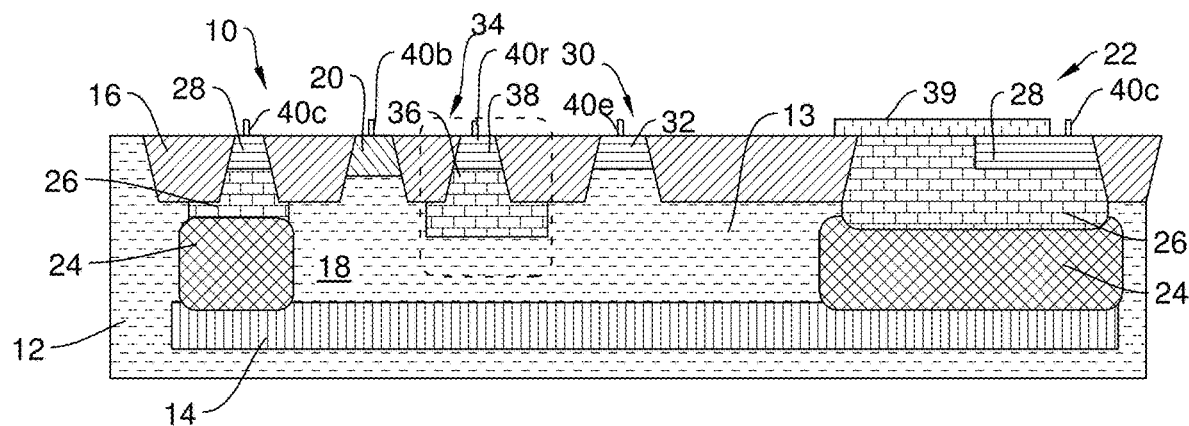

In FIG. 1D, contacts 40b, 40c, 40e and 40r are provided on the base contact region 20, the collector contact region 28, the emitter contact region 30 and the resistance contact region 38, respectively, for applying voltages to these contact regions. The contacts 40b, 40c, 40e and 40r may be formed using a silicide process. For example, as should be understood by those of skill in the art, the contacts 40b, 40c, 40e and 40r may be formed with a silicide process using a silicide block layer (SBLK) 39 on an upper surface of the ESD device 10 which are to be protected from the silicide process, e.g., over high impurity concentration collector well 26. A thin transition metal layer, e.g., nickel, cobalt or titanium, is deposited over fully formed and patterned semiconductor devices. After deposition of the material, the structure is heated allowing the transition metal to react with exposed silicon (or other semiconductor material as described herein) in the base contact region 20, the collector contact region 28, the emitter contact region 32 and the resistance contact region 38, forming a low-resistance transition metal silicide. Following the reaction, any remaining transition metal is removed by chemical etching, leaving silicide contacts on the base contact region 20, the collector contact region 28, the emitter contact region 32 and the resistance contact region 38 in the ESD device 10 shown in FIG. 1D. The mask 39 can then be removed. Thereafter, contacts 40b, 40c, 40e and 40r are formed to the silicided regions using conventional CMOS processes known to those of ordinary skill in the art such that no further explanation is required herein for a complete understanding of the present disclosure.

In the arrangement shown in FIG. 1D, the base contact region 20 and emitter contact region 32 are both coupled to a ground voltage via the contacts 40b and 40e, respectively. The collector contact region 28 may be connected to receive any ESD surge voltage that occurs, via the contact 40c, to turn on the ESD device to avoid the ESD surge voltage from damaging the protected circuit. The ESD device can normally be turned off when no ESD event is occurring. Also, optionally, the collector contact region 28 may be coupled to a collector bias voltage via the contact 40c. The resistance well 36 may be connected to a bias voltage via the contact 40r. It is noted that the contact 40r shown for the resistance contact region 38 is optional, and can be omitted if a bias voltage is not provided to the resistance well 36.

Figure 2:
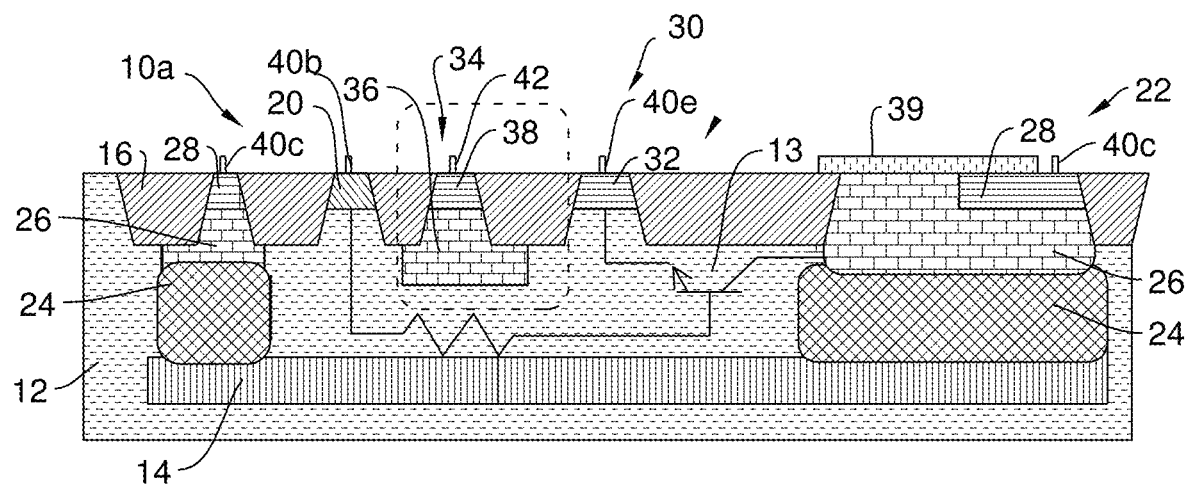
FIGS. 2-5 show electrostatic discharge (ESD) devices in accordance with other aspects of the present disclosure.

FIGS. 2-5 show electrostatic discharge (ESD) devices in accordance with other aspects of the present disclosure. For example, FIG. 2 shows an ESD device 10a that includes a collector voltage contact 42 on the resistance contact region 38, instead of the contact 40r shown in FIG. 1D (which is connected to a bias voltage other than the collector bias voltage applied to the contact 40c). This allows a collector voltage that is applied to the contact 40c on the collector contact region 28 to also be applied to the resistance well contact region 38 and the resistance well 36 via the collector voltage contact 42.

Figure 3:
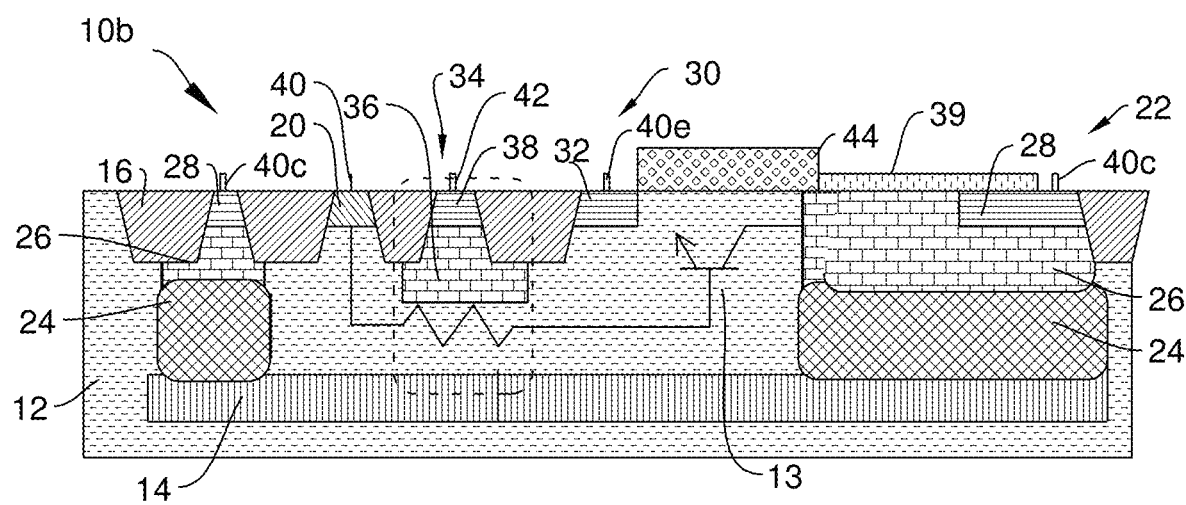
Figure 4:
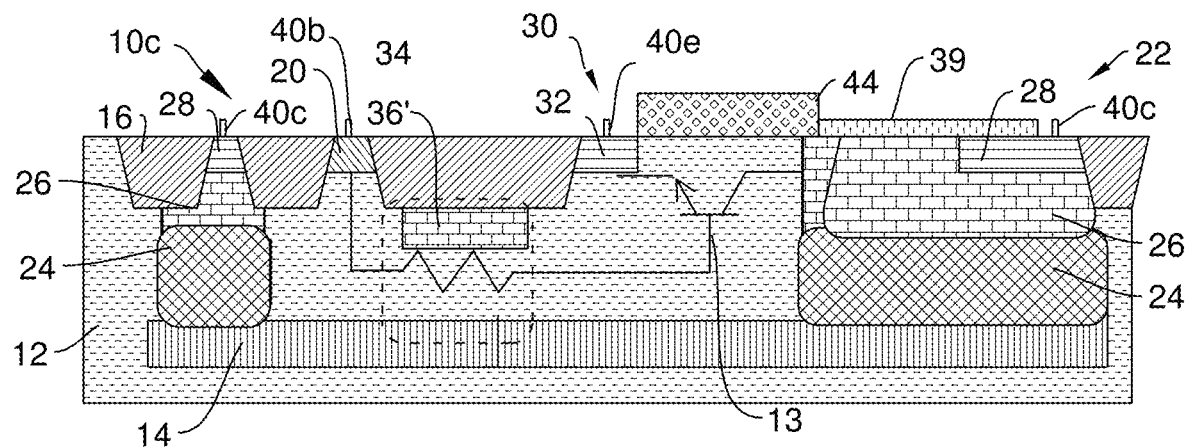

FIG. 3 shows an ESD device 10b, comprising a polysilicon layer 44 (which may be connected to the emitter contact region 32 with a contact and metal), between the emitter contact region 32 and well 26 for the formation of a gate structure. This allows use of standard CMOS processing for the formation of the NPN and/or PNP devices discussed herein for providing ESD devices.

In the ESD structures 10, 10a and 10b shown in FIGS. 1D, 2 and 3, an upper surface of the reverse-type doped resistance well 36 may be exposed to an upper surface of the device, and can either be floating (i.e., have no electrical connections to external voltages), as in FIG. 1D, or connected, via the contact 42, to a collector bias voltage that is applied to the collector contact region 28. Alternatively, the reverse-type doped resistance well may be a buried reverse-type doped resistance well 36' formed under one of the shallow trench isolation regions 16 formed in the upper surface of the substrate 12 between the base contact region 20 and the emitter contact region 32, as shown for the ESD device 10c in FIG. 4.

Figure 5:
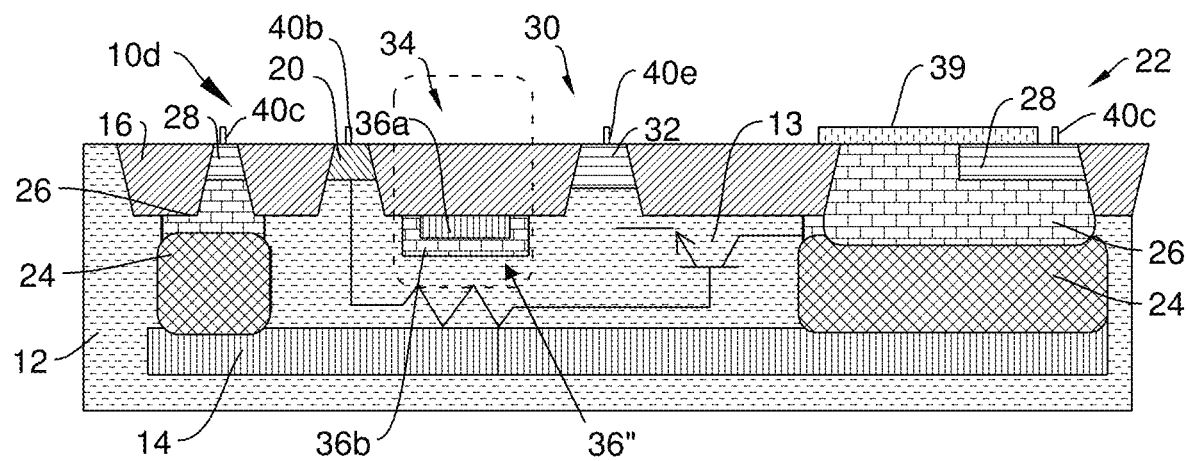

FIG. 5 shows a structure 10d which includes a variable impurity concentration floating buried reverse-type doped resistance well 36" having a higher concentration density at an upper portion thereof than a concentration density at a lower portion thereof. This may be achieved by providing a high impurity upper region 36a and a low impurity lower region 36b in the well 36". Solely for purposes of a non-limiting example, the reverse-type doped resistance well 36" shown in FIG. 5 may be doped at a level of about $1 \times 10^{18}$ cm$^{-3}$ in the high impurity upper region 36a and at a level of about $1 \times 10^{17}$ cm$^3$ in the low impurity lower region 36b.

Alternatively, solely for purposes of a non-limiting example, the reverse-type doped resistance well 36" can have a gradual variation in impurity concentration density from a higher impurity concentration of about $1 \times 10^{18}$ cm$^{-3}$ in the upper portion of the reverse-type doped resistance well 36" to a lower impurity concentration of about $1 \times 10^{17}$ cm$^{-3}$ in the lower portion of the reverse-type doped resistance well 36". It is noted that the reverse-type doped resistance well 36 in the structures shown in FIGS. 1D, 2 and 3 can also have a gradual variation in impurity concentration density from a higher impurity concentration in an upper portion of the reverse-type doped resistance well 36 to a lower impurity concentration in a lower portion of the reverse-type doped resistance well 36.

FIGS. 6A and 6B show a top view and a cross-sectional view, respectively, of an electrostatic discharge (ESD) device shown in FIG. 2. Lines are provided between the top view and the cross-sectional view (of the structure shown in FIG. 2) to show the relationship between the structures, e.g., the collector contact 40c, the base contact 40b, the resistance contact 42, the emitter contact 40e, the silicide block layer 39 and the collector contact 40c exposed from the silicide block layer 39.

FIGS. 7A and 7B show a top view and a cross-sectional view, respectively, of an electrostatic discharge (ESD) device shown in FIG. 2, but using non-continuous resistance contact regions 42' instead of the continuous resistance contact region 42 shown in FIGS. 6A and 6B. In other words, the resistance contact arrangement provided in the structure of FIG. 7A may be a plurality of separated resistance contacts 42' instead of a single continuous resistance contact 42 shown in FIG. 6A. Lines are provided between the top view and the cross-sectional view (of the structure shown in FIG. 2) to show the relationship between the structures, e.g., the collector contact region 28, the base contact 40b, the non-continuous resistance contacts 42', the emitter contact 40e, the silicide block layer 39 and the collector contact 40c exposed from the silicide block layer 39.

Figure 8:
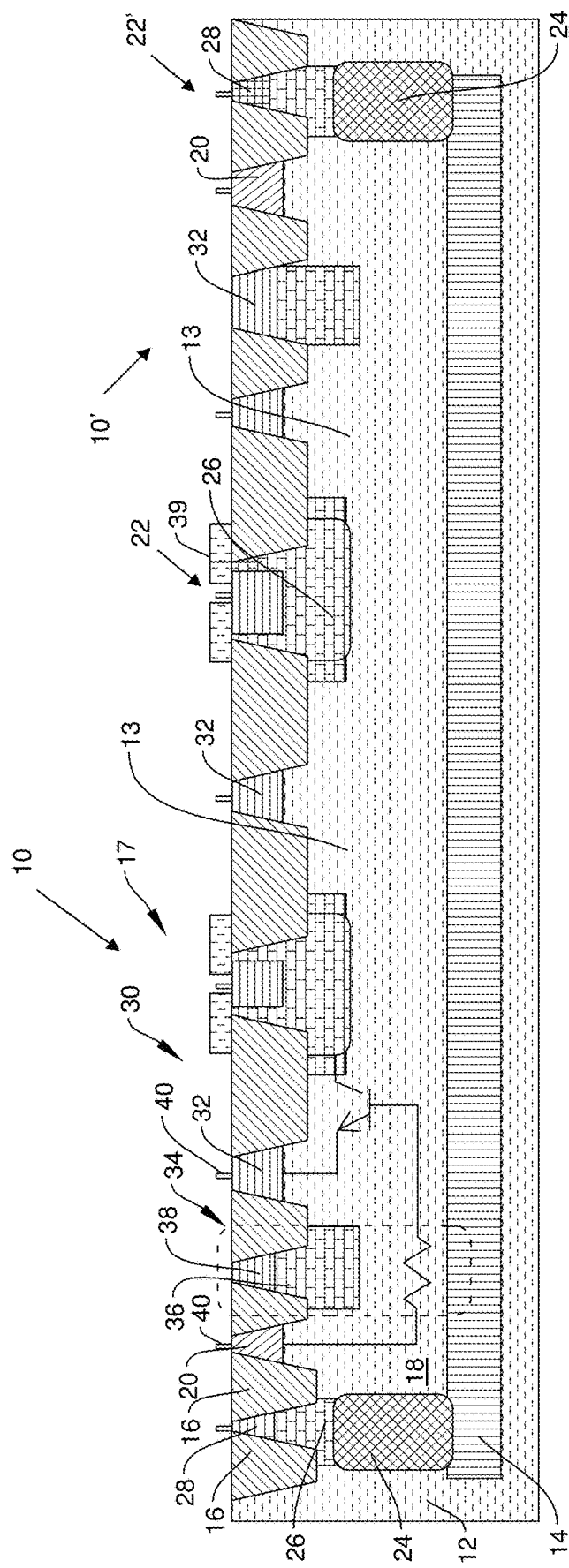
FIG. 8 shows a cross-sectional view of an electrostatic discharge (ESD) device with a multi-finger collector and emitter structure in accordance with other aspects of the present disclosure.

FIG. 8 shows a cross-sectional view of an electrostatic discharge (ESD) device with a multi-finger collector and emitter structure in accordance with other aspects of the present disclosure. The structure shown in FIG. 8 is similar to multiple adjoined structures shown FIG. 1D, now labeled 10, 10'. Specifically, in FIG. 8 two adjacent collector regions 22 and 22' of respective adjacent ESD devices 10 and 10' are separated by an intervening emitter contact region 32, and provide two parallel ESD devices 10, 10' in a mirror image arrangement to one another (i.e., a two finger ESD arrangement). By virtue of there being two ESD devices 10, 10', the combination of the ESD devices is capable of handling a higher ESD surge. Of course, the illustration of two side-by-side parallel ESD devices 10, 10' in FIG. 8 is solely for purposes of example, and the number the of fingers may be variable depending on the ESD level requirement.

As should now be understood, in this layout the addition of the resistance region 34 in the base well 18 ensures that all of the ESD devices in a multi-finger ESD arrangement will be triggered, as discussed below with regard to FIGS. 9A and 9B, at a voltage closer to the DC breakdown voltage of the ESD devices than for ESD devices without the resistance region 34. It should be understood that these resistance values are exemplary, and that such resistance values may be increased or decreased based on different variables, e.g., types of materials, and doping profiles.

Figures 9A, 9B:
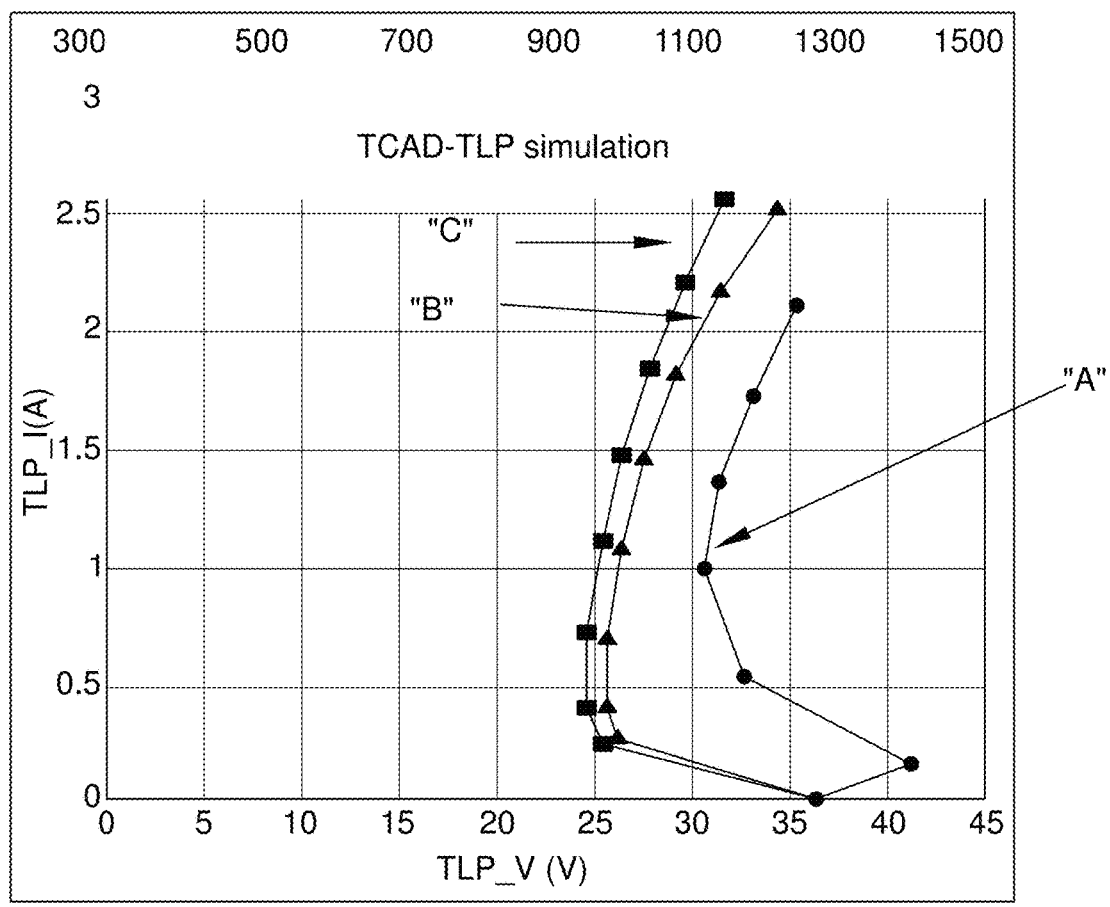
FIGS. 9A-9B show a graph and a table, respectively, comparing ESD devices of the present disclosure with ESD devices that do not have a resistance well arrangement in accordance with aspects of the present disclosure.

FIGS. 9A and 9B respectively show a graph and a table comparing ESD devices of the present disclosure with an ESD device that does not have the resistance region 34 as discussed with regard to FIGS. 1D and 2-8. The graph of FIG. 9A is a TCAD simulation showing comparison between the ESD devices 10 described in FIG. 1D (Device "B"), an ESD device that does not have resistance region 34 (Device "A"), and an ESD device 10a described in FIG. 2 (Device "C"). The x-axis represents voltage and the y-axis represents current.

As shown in FIGS. 9A and 9B, the Device "A" represented by line "A" has a trigger voltage of 42.07V and a breakdown voltage of 33.4V. This is a voltage difference of 8.67V between the trigger voltage and the breakdown voltage. The Device "B" represented by line "B", shown for example in FIG. 1D, has a trigger voltage of 37.00V and a breakdown voltage of 33.3V. This is a voltage difference of only 3.7V between the trigger voltage and the breakdown voltage. Similarly, the Device "C" represented by line "C", shown for example in FIG. 2, has a trigger voltage of 36.47V and a breakdown voltage of 33.0V. This is a voltage difference of only 3.47V between the trigger voltage and the breakdown voltage.

Therefore, as shown in FIGS. 9A and 9B, devices utilizing the reverse-type doped resistance well 36 in the base well 18, such as shown in FIGS. 1D and 2-8, have lower trigger voltages, which are much closer to the DC breakdown voltages compared to ESD devices without the reverse-type doped resistance well 36 in the base well 18. This helps to prevent late turn-on and significantly improves the protection capabilities of the ESD devices using the reverse-type doped resistance well 36 in the base well region 18.

The ESD devices may be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips may be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product may be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
  a bipolar transistor device comprising:
    a base region comprising a base contact region in a first well of a first conductivity type;
    a collector region comprising a collector contact region in a second well of a second conductivity type; and
    an emitter region comprising an emitter contact region in the first well, located between the base contact region and the second well; and
  a reverse-doped resistance well of the second conductivity type located in the first well of the first conductivity type between the base contact region and the emitter contact region and structured to decrease turn-on voltage of the bipolar transistor device.

2. The structure of claim 1, wherein the base contact region and the emitter contact region are connected to one another and to ground.

3. The structure of claim 1, wherein an upper surface of the reverse-doped resistance well is located at an upper surface of a substrate.

4. The structure of claim 3, further comprising a contact configured to apply a voltage to an upper surface of the reverse-doped resistance well.

5. The structure of claim 4, wherein the contact connects to the collector contact region.

6. The structure of claim 1, wherein the reverse-doped resistance well comprises a floating well.

7. The structure of claim 6, further comprising a shallow trench isolation region over the reverse-doped resistance well in an area between the base contact region and the emitter contact region.

8. The structure of claim 1, wherein the reverse-doped resistance well comprises a higher concentration density at an upper portion thereof than a concentration density at a lower portion thereof.

9. The structure of claim 1, further comprising a polysilicon region formed on an upper surface of a substrate between the emitter contact region and the collector contact region.

10. The structure of claim 1, further comprising an isolation region located in a substrate under the first well, the second well and the reverse-doped resistance well.

11. The structure of claim 1, further comprising a resistance well contact region in the reverse-doped resistance well, a resistance well contact on the resistance well contact region, a collector contact on the collector contact region, a base contact on the base contact region, and an emitter contact on the emitter contact region.

12. The structure of claim 11, wherein the resistance well contact comprises a continuous ring when the structure is viewed from a top view of the structure.

13. The structure of claim 11, wherein the resistance well contact comprises a plurality of separated individual contact regions spaced apart from one another on the resistance well contact region when the structure is viewed from a top view of the structure.

14. A bipolar transistor device comprising:
  a substrate having a first conductivity type;
  an isolation region of a second conductivity type in the substrate;
  a base contact region in a first well of the first conductivity type over a first portion of the isolation region;
  a collector contact region in a second well of the second conductivity type over a second portion of the isolation region;
  an emitter contact region in the first well and located between the base contact region and the second well; and
  a reverse-doped resistance element comprising a third well having the second conductivity type, located in the first well of the first conductivity type between the base contact region and the emitter contact region.

15. The bipolar transistor device of claim 14, wherein the base contact region and the emitter contact region are connected to one another and to ground.

16. The bipolar transistor device of claim 14, wherein an upper surface of the third well is located at an upper surface of the substrate.

17. The bipolar transistor device of claim 16, further comprising a contact applying a voltage to the upper surface of the third well.

18. The bipolar transistor device of claim 17, wherein the contact is connected to the collector contact region.

19. The bipolar transistor device of claim 14, wherein the third well comprises a floating well.

20. A method comprising:
  forming a bipolar transistor device, including a base region, having a base contact region, in a first well of a first conductivity type, a collector region, having a collector contact region, in a second well of a second conductivity type, and an emitter region, having an emitter contact region, in the first well, located between the base contact region and the second well; and forming a reverse-doped resistance well, of the second conductivity type, located in the first well of the first conductivity type between the base contact region and the emitter contact region and structured to decrease turn-on voltage of the bipolar transistor device.

\* \* \* \* \*